United States Patent [19]

Cope

[11] Patent Number: 4,528,596

[45] Date of Patent: Jul. 9, 1985

[54] SUPPRESSION OF EDGE EFFECTS ARISING IN CCD IMAGER FIELD REGISTERS

[75] Inventor: Appleton D. Cope, Hightstown, N.J.

[73] Assignee: RCA Corporation, Princeton, N.J.

[21] Appl. No.: 445,549

[22] Filed: Nov. 30, 1982

[51] Int. Cl.³ .............................................. H04N 5/30
[52] U.S. Cl. .................................... 358/213; 358/209; 358/41; 357/24
[58] Field of Search ............... 358/212, 213, 293, 209, 358/45, 41, 163, 167; 357/24 LR; 250/578

[56] References Cited

U.S. PATENT DOCUMENTS 4,320,413 3/1982 Takemura .............................. 358/44
4,367,492 1/1983 Harada ................................. 358/213

FOREIGN PATENT DOCUMENTS 0087619 8/1978 Japan ................................. 358/213
0127621 10/1979 Japan ................................. 358/213
0051170 10/1981 Japan ................................. 358/213

Primary Examiner—Gene Z. Rubinson
Assistant Examiner—Robert Lev
Attorney, Agent, or Firm—Joseph S. Tripoli; George E. Haas; Allen LeRoy Limberg

[57] ABSTRACT

If drain structures bound the field register(s) of a CCD imager on the sides parallel to the direction of charge transfer therethrough, some portion of the charge carriers generated by photoemission will be lost to the drain structures from the charge transfer channels along those sides. If the charge transfer channels along those sides of the field register(s) do not have register boundary drain structures alongside them, on the other hand, charge carriers from the semiconductor substrate outside the field register(s) will migrate to them. These charge carriers may be thermally generated "dark current", for example. In either case the side charge transfer channels do not have adjacent charge transfer channels that the other charge transfer channels in the field register(s) do, leading to undesired edge effects in the outputs of these side charge transfer channels. To eliminate the need for relatively complex blanking circuitry following the CCD output register, these outputs are not forwarded to the output register used for parallel-to-series conversion of image samples supplied from the field register(s).

5 Claims, 4 Drawing Figures

SUPPRESSION OF EDGE EFFECTS ARISING IN CCD IMAGER FIELD REGISTERS

The Government has rights in this invention pursuant to Contract No. N66001-80-C-0223 awarded by the Department of the Navy.

The present invention concerns CCD imagers that use field registers and output registers and, more particularly, ones in which edge effects arising in the field register(s) are eliminated from the imager output signal.

In CCD imagers that use separate image and output registers, the output register typically comprises a charge transfer channel the stages of which during selected intervals in time are loaded in parallel from the outputs of charge transfer channels parallelly arranged in a field register. In different types of CCD imagers in which the present invention can find application, this field register may be the image register in which photodetection takes place, or it may be a field storage register interposed between an image register and the output register. The charge packets loaded parallelly into the output register stages are supplied serially from its output.

The lifetime of charge carriers in the semiconductor substrate on which the imager is formed is relatively long compared to the time for charge integration in the image register, transfer of charge from the image register to the output register and parallel-to-series conversion in the output register. Charge carriers generated in the bulk, rather than in the depletion regions induced by applying voltages to the image register gate electrodes, may diffuse from that portion of the image register across which one charge transfer channel extends to an adjacent charge transfer channel, where they are collected into a depleted region. As between two adjacent charge transfer channels in the image register, this process leads to some loss of spatial resolution in the portions of the image they accumulate charge packets descriptive of. This loss of resolution is in the direction perpendicular to the charge transfer channels. But this process does not affect the total amount of charge collected in the channels.

As between each of the charge transfer channels at the sides of the image register and what lies beside them outside the image register, however, there is substantial probability of the charge collected by that charge transfer channel being appreciably affected, thereby to generate undesirable edge effects. If the sides of the image register are bounded by drain structures—e.g., antiblooming drains—some charge carriers will pass into the drains and never be collected, reducing from its proper amount the charge collected by the imager. If the sides of a field register (whether image register or field storage register) are bulk substrate, extra charge carriers, generated in that portion of the bulk owing to dark-current-generating effects or to photoemissive response to stray light, will migrate to the charge transfer channels in the sides of the field register and increase from its proper amount the charge collected by the imager.

The CCD imager field registers could have extra charge transfer channels added to each side of them to avoid edge effects in the channels they adjoin, and the charge packets spoiled by edge effects and clocked through these extra channels could be discarded.

It is preferable, in accordance with the invention, to discard the charge packets from the outputs of these extra channels through drains, rather than admitting them into the imager output register. This, to avoid the complexity of having to selectively blank output signals from the imager output register. In an improved CCD imager constructed in accordance with an aspect of the present invention then, the output register is operated so as to admit input charge packets into respective ones of its stages only if they originate in respective ones of the charge transfer channels of the image register exclusive of the side charge transfer channels on each side of the register. This implements the method of suppressing edge effects provided by discarding charge packets from the side charge transfer channels of the image register, rather than admitting them into the imager output register and then blanking the response to these charge packets in the imager output signal, which method is an aspect of the present invention.

Figure 1:
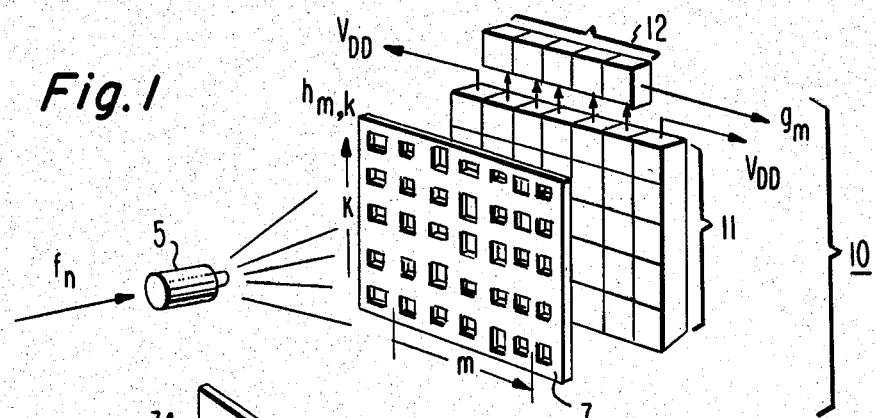
FIG. 1 is a functional diagram of an electro-optical signal processor modified so as to embody the invention.

The general type of electro-optical signal processor shown in FIG. 1 is described in the article "Incoherent Optical Signal Processing Using Charge-Coupled Devices (CCD's)" by K. Bromley et al. in *SPIE Vol. 118—Optical Signal & Image Processing* (IOCC 1977) pp. 118–123. This processor comprises a light-emitting diode (LED) 5 providing a regularly flashing light source of modulated intensity for illuminating a light mask 7, which is in contact with an image register 11 of a charge-coupled device (CCD) imager 10. (The mask, shown exploded from the surface of image register, is conveniently made by evaporating a thin layer of chromium on the imager 10 surface, followed by selective etching.) The image register 11 is a field register. It comprises a plurality, $M+2>3$, of parallelled charge transfer channels consecutively ordinally numbered left to right $0^{th}$ through $(M+1)^{st}$, represented by the columns on the surface of imager 10 facing the viewer. Each channel contains a like number of image integrating sites or pixels. The squares arrayed in row and in column on the CCD surface facing the viewer each represent an image integrating site. The imager 10 departs from usual construction in that in accordance with the invention charge packets integrated in the $0^{th}$ and $(M+1)^{st}$ charge transfer channels at the left and right sides of image register are periodically clocked forward to drains connected to a drain voltage $V_{DD}$ supply. The charge packets integrated on the other, first through $M^{th}$, charge transfer channels of image register 11 are periodically clocked forward to respective stages of an output register 12 which performs a parallel-to-series conversion to supply successive samples of an output analog sampled-data sequence $g_m$.

The input signal temporally modulating the intensity of light from LED 5 is an analog sampled-data sequence $f_{n_0+n}$ flashed at a sampling rate of $r_1$ samples per second, $n_o$ being used to designate an arbitrary time origin and n assuming successive integral values at each successive sampling time. Mask 7 contains an M by K array of apertures with respective optical transmittance values $h_{m,k}$ in registration with respective pixels of the first through $M^{th}$ charge transfer channels of register 11. The mask 7 aperture patterns over the first and $M^{th}$ channels adjacent to the $0^{th}$ and $(M+1)^{st}$ side channels are essentially repeated (possibly enlarged somewhat) over the side channels, so the side channels tend to integrate charge packets equal to these integrated in the channels adjacent to them. The light falling on the m,$k^{th}$ element of the CCD will integrate to provide an analog charge packet of amplitude $$f_{n_o+n}h_{m,k}$$

The vertical shift rate in the imager 10 at which charge packets are clocked upward from one charge integration site to the next is made to equal $r_1$. So a running sum of the products of the time-varying intensity of LED 5 radiance and the space-varying transmittance of mask 7 apertures in each charge transfer channel is clocked out each cycle of $r_1$ sampling rate to a respective one of the stages of output register 12. As a row of charge samples is clocked upward in image register 11 from the bottom row (k=n=1) to the top row (k=n=K) the accumulated charge in a column takes on the following value:

$$\sum_{n=1}^{K} f_{n_o+n}h_{m,n} = g_{m,n_o}$$

$$m = 1, 2, 3, \ldots, M$$
$$n_o = \ldots, -2, -1, 0, 1, 2, 3, \ldots$$

This is equivalent to matrix vector multiplication of the following form for given $n_o$:

$$[h_{m,n}] \times [f_n] = [g_m].$$

The important part of the FIG. 1 processor insofar as the present invention is concerned is that integration errors in the first and $M^{th}$ columns are reduced by virtue of the operation of the adjoining $0^{th}$ and $(M+1)^{st}$ columns. There is a discarding of their clocked-upward outputs to drain supply, rather than their clocked-upward outputs being entered into output register 12. This avoids the complexity of discarding these samples by selectively blanking output register 12 output signal.

Figure 2:
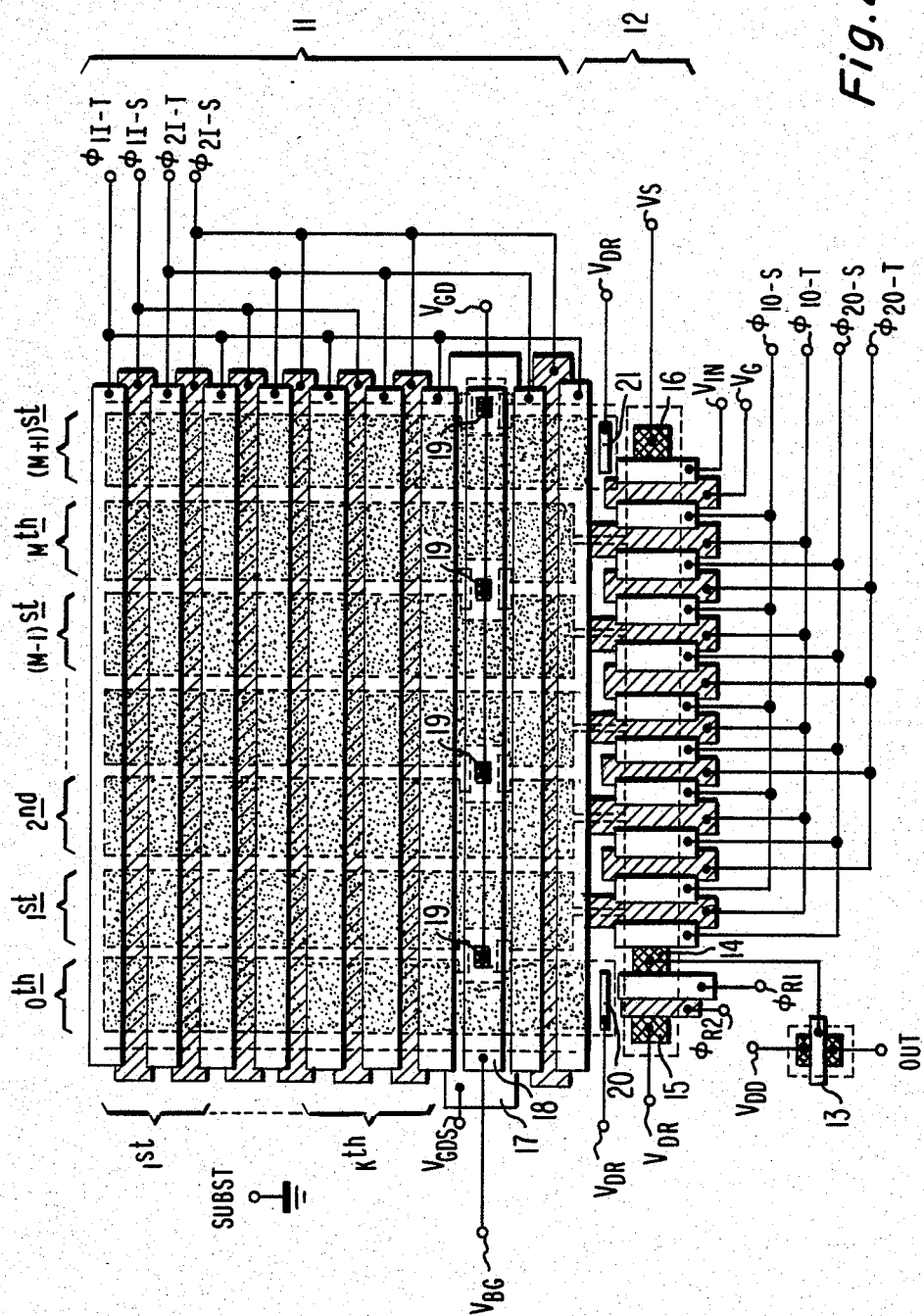
FIG. 2 is a plan view schematic of a CCD imager constructed in accordance with the invention for use in an electro-optical processor of the sort shown in FIG. 1.

FIG. 2 shows a plan-view schematic of the front surface of a CCD imager for use in a processor like that shown in FIG. 1. The columns of pixel locations are consecutively ordinally numbered $0^{th}$ through $(M+1)^{st}$ at the top of the figure, and the rows of pixel locations are consecutively ordinally numbered $1^{st}$ through $K^{th}$ at the left side of the figure. The FIG. 2 imager uses two-phase clocking of its buried-channel image register 11 and output register 12, which are constructed with a two-level polysilicon gate architecture. The FIG. 2 imager is designed to be front-surface-illuminated to facilitate the chromium light mask 7, stripped away in FIG. 2 to reveal the underlying CCD structure, being evaporated to an opaque-to-light 500 Å or so thickness on the front surface and then being photo-etched to provide the apertures in registration over image-integrating pixel sites. A metal-oxide-semiconductor field effect transistor MOSFET) 13 provides source-follower output response to potential on a floating diffusion 14 at the output end of output register 12. Floating diffusion 14 is periodically clamped to a direct drain potential $V_{DR}$ applied to a drain diffusion 15, using properly timed $\phi_{R1}$ and $\phi_{R2}$ reset pulses applied to successive ones of the intervening pair of reset gates. At the input end of output register 12 a direct source voltage $V_s$ is applied to a source region 16 and bias charges (e.g., "fat zero" charges) can be admitted by applying properly-phased $V_{IN}$ and $V_G$ pulses to the gates at the beginning of output register 12.

The generation of the two-phase clock signals and the pulses to control the CCD imager operation is per conventional design, so the timing generator for generating these conventional operating voltages is not shown. The conventional feature used in implementing two-phase operation, ion implanted barriers under the trailing edges of the gate electrode structures for the direction of charge transfer, is not shown in FIG. 2 for purposes of clarity. The image or I register 11 has $\phi_{1I}$ clocking phase applied at two direct bias levels as $\phi_{1I-T}$ and $\phi_{1I-S}$ to odd-numbered transfer gates and to odd-number storage gates, respectively, ordinally numbering the gate pairs first through $K^{th}$ from top of FIG. 2 down. The second clocking phase $\phi_{2I}$ is applied at two direct bias levels as $\phi_{2I-T}$ and $\phi_{2I-S}$ to even-numbered transfer gates and to even-numbered storage gates respectively in image register 11. These clock phases have $r_1$ repetition rate. Four successive gate electrode structures are associated with each image integrating site or pixel, so one will note the FIG. 2 imager structure is foreshortened in the vertical direction to three pixels per column as compared to the five pixels per column of FIG. 1 imager 10. This foreshortening does not affect the operation insofar as the invention is concerned and is made so the schematic will fit within the confines of a standard sheet without overly reducing the size of important features. Electro-optical signal processors which are practically advantageous for implementing matrix multiplications will, of course, normally have a number M of actively used columns and a number K of pixel rows both much larger than the five shown for each in FIG. 1.

In performing matrix multiplication only the $K^{th}$ terms of the running sums generated at the outputs of the $1^{st}$ through $M^{th}$ of the imager columns are of interest, and the (K−1) earlier items are discarded. If one clocks all the running sum terms through the output register 12 its clock rate $r_2$ must equal or exceed M times the clock rate $r_1$ advancing charge samples through imager register 11, as noted in the description of the FIG. 1 processor 10. Arranging to dump all charge packets in the running sum of each imager column, previous to the $K^{th}$, will allow the output register clock rate to be reduced by a factor of K. The reduced output register clock rate $r_2' \geq (Mr_1)/K$.

The FIG. 2 imager has structure for dumping the (K−1) earlier terms in the running sums. The $\phi_{1I}$-clock-phase transfer electrode in the $K^{th}$ row is followed by a first-polysilicon-layer storage electrode 17 that receives a $V_{GDS}$ pulse in synchronism with $\phi_{1I-S}$ only when the $K^{th}$ term charge packets are transferred to wells thereunder, allowing those packets to be clocked forward to side-load the output register 12. When these $K^{th}$ term charge packets are being clocked forward normally, no $V_{BG}$ pulse is applied to a second-polysilicon-layer electrode 18 for dumping the charge packets into drain sites 19 at the sides of the charge transfer channels under the storage gate electrode 17. At previous times, when the charge packets descriptive of terms of the running sums previous to the $K^{th}$ are clocked to wells induced under storage gate electrode 17, no $V_{GDS}$ pulse is applied to 17 as will permit charge to be clocked forward. Instead $V_{BG}$ pulse is applied to gate electrode structure 18 overlying storage gate electrode 17 to provide a conductive path through field-effect-transistor action between the charge transfer channels as virtual sources and drain regions 19 connected in common to a direct drain voltage $V_{GD}$.

The side-loaded output register 12 is clocked at $r_2'$ rate in $\phi_{10}$ and $\phi_{20}$ phases. The $\phi_{10}$ phase is applied at two direct bias levels as $\phi_{10\text{-}S}$ and $\phi_{10\text{-}T}$ to alternate ones of the storage gates and to alternate ones of the transfer gates, respectively, of output register 12. The $\phi_{20}$ phase is applied at two direct bias levels as $\phi_{20\text{-}S}$ and $\phi_{20\text{-}T}$ to the remaining storage gates and to the remaining transfer gates, respectively, in register 12. The $K^{th}$ terms of the running sums of the first through $M^{th}$ columns are supplied seriatim at $r_2'$ clock rate to floating diffusion 14 and voltages proportional to the charge under floating diffusion 14 are provided at the source of source-follower transistor 13.

The details of FIG. 2 imager construction set forth above are incidental to the invention in which extra charge transfer channels are placed alongside the field register used for imaging. The $0^{th}$ channel at the left side and the $(M+1)^{st}$ channel at the right side of this image register 11 do not have outputs to stages in the output register 12, in accordance with the invention, but instead terminate in drain regions 20 and 21, respectively, each returned to $V_{DR}$ drain potential. The charge packets spoiled by edge effects are dumped into drains 20 and 21, and there is no need to selectively blank responses to these charge packets in the output from floating diffusion 14 or from source-follower 13.

Figure 3:
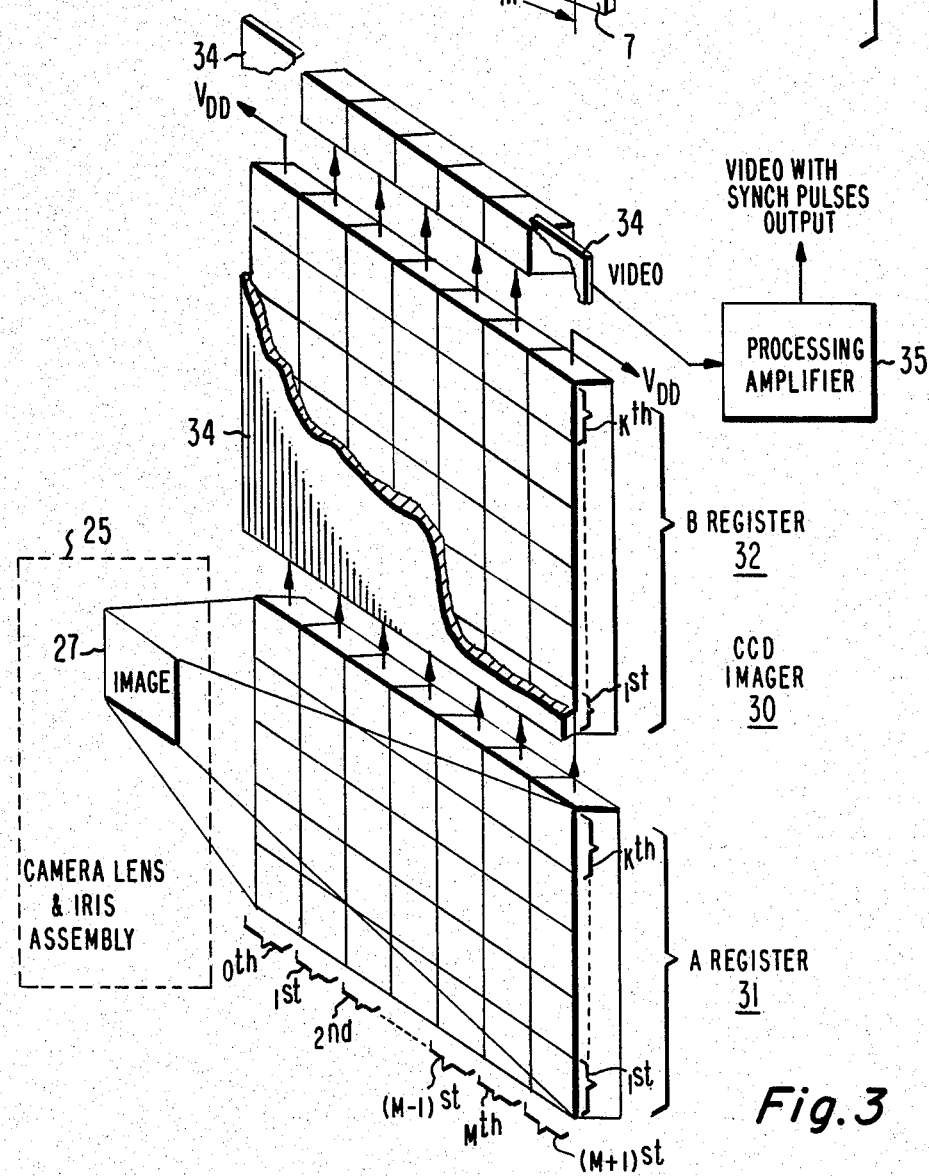
FIG. 3 is a functional diagram of a television camera modified to embody the invention.

FIG. 3 is a schematic of a CCD black-and-white television camera in which the invention is used. A conventional camera lens and iris assembly is used to project an image onto the A or image register 31 of a CCD imager 30 of the field transfer type. The image is preferably projected so that it overscans the first through $M^{th}$ columns of the A register 31 and that the edge portions of it fall on the $0^{th}$ and $(M+1)^{st}$ columns of A register 31. Image integration takes place over a field scan interval during which time the clocking to the A register 31 is halted. Charge packets sampling the previous integrated image and subsequently transferred to the field store or B register 32 are, during the current image integration time, clocked forward in the B register 31 one row at a time during line retrace intervals. The charge packets sampling image that are clocked out of the $1^{st}$ through $M^{th}$ columns of the B register 32 are side-loaded into the output or C register used for parallel-to-series conversion. The charge packets sampling edge portions of the image, anomalous due to edge effects, are drained off to $V_{DD}$ drain voltage supply in accordance with the invention. During line trace the C register is clocked at pixel scan rate to provide a line of video samples to processing amplifier 35, which inserts synchronizing pulses to generate camera output signal. Processing amplifier 35 responds to the same timing generator (not shown) as is used to time the clocking signals applied to A register 31, B register 32 and C register 33 of imager 30.

Image integration takes place only in the A register 31. A mask 34, shown in cut-away to reveal the connections of registers 31, 32 and 33 is used to shield B register 32 and C register 33 from light. The mask 34 which can be evaporated directly on the CCD imager surface and photo-etched to final dimensions, may overlap the last few rows of the A register, to avoid light creeping past the mask into B register 32. (This is not shown).

Between image integration times, coincidental with field retrace, both the A register 31 and B register 32 are clocked to transfer the charge packets sampling the image field, which have been integrated in A register 31, from that register to B register 32. In FIG. 3 the charge packets clocked out of the $0^{th}$ and $(M+1)^{st}$ columns of A register 31 are forwarded to corresponding columns in B register 32, which terminate in drains 20 and 21. This is advantageous in that charge carriers thermally generated in the bulk underlying the B register 32 exchange in like numbers from below each of the $0^{th}$ and $1^{st}$ or $M^{th}$ and $(M+1)^{st}$ columns to below the other, before collection in the charge transfer channel wells, thus avoiding an edge effect that can become noticeable at higher camera temperatures.

However, the preponderant portion of charge packets in the B register 32 are forwarded from A register 31 and thus are already collected in depletion regions from which they cannot escape back into the bulk. So, one may alternatively terminate the $0^{th}$ and $(M+1)^{st}$ columns of the A register in drains, rather than forwarding their outputs to corresponding columns in the B register. And then in a further variant one may then dispense with the $0^{th}$ and $(M+1)^{st}$ columns in the B register 32. Or in a still further variant one may retain the $0^{th}$ and $(M+1)^{st}$ columns in the B register and use one or the other or both of them for integrating dark current to implement schemes for reducing field shading attributable to dark currents.

Color television cameras using the invention are, of course, possible. A color pattern filter may be interposed between the camera lens and iris assembly 25 and A register 31 to modify the FIG. 3 camera for color operation; this is the so-called "single-chip" color camera approach. A better color television camera can be constructed using a color-separating beam-splitter following the camera lens and iris assembly 31 and projecting the separated colors into the A registers of CCD imager 30 and of further CCD imagers of like type. The separated colors may, for example, be the additive primaries, so the imagers supply R,G,B (red, green, blue) video output signals to be matrixed in the processing amplifier. Or, as a further example, the separated colors may be the additive complementary colors cyan, magenta and yellow.

Figure 4:
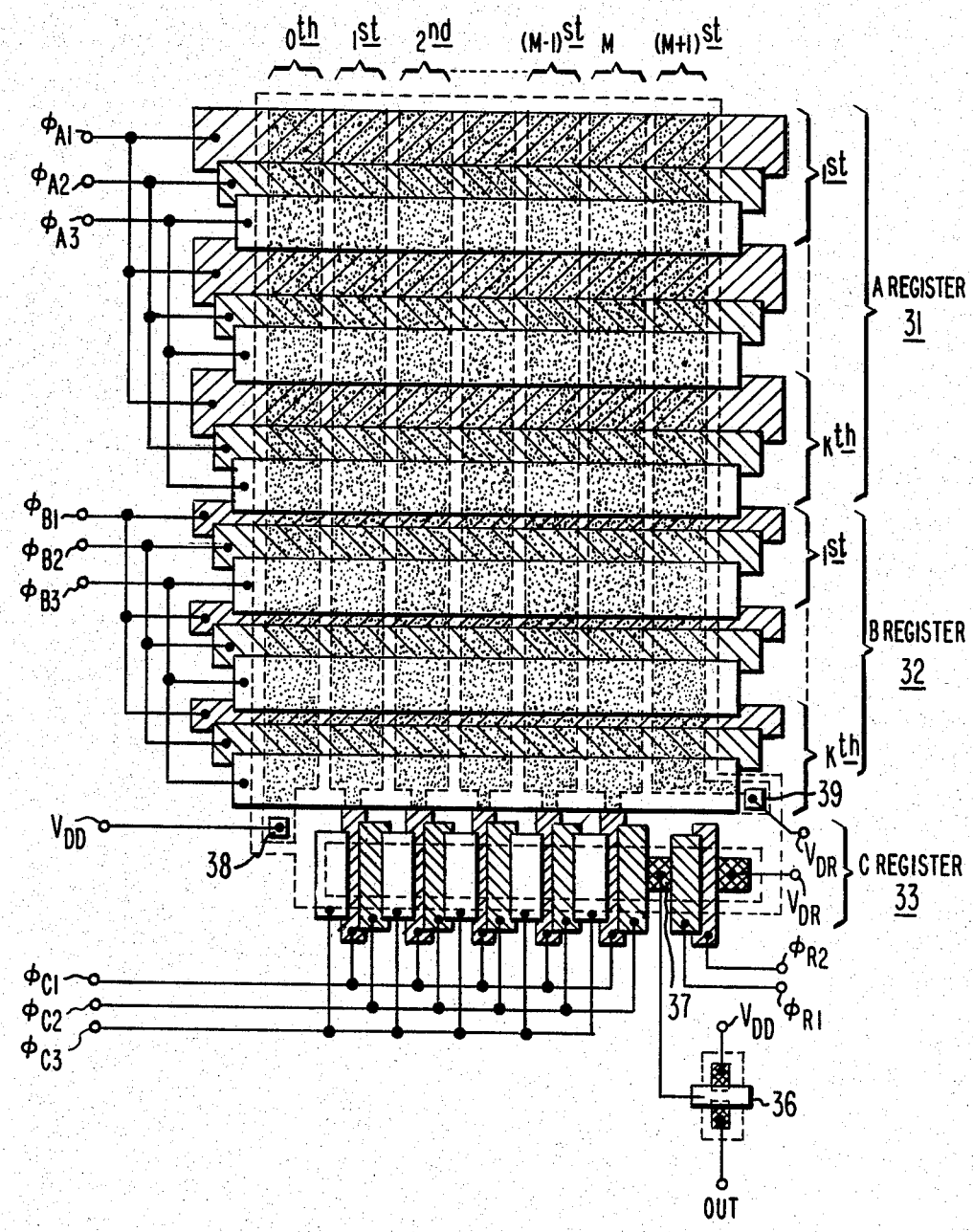
FIG. 4 is a plan view schematic of a CCD imager of the field transfer type constructed in accordance with the invention for use in a television camera of the sort shown in FIG. 3.

FIG. 4 shows a plan view schematic of the front surface of a back-surface-illuminated field transfer type of CCD imager suitable for use in a television camera of the sort shown in FIG. 3. The A register 31 and B register 32 are each shown as comprising seven columns and three rows, this foreshortening in each direction being done to accomodate drafting limitations. Typically between 300 and 500 columns and between 200 and 600 rows are actually used in these registers, with the C register 33 being lengthened to suit. FIG. 4 is also simplified not to show certain standard construction features of a CCD imager for television camera use— e.g., the anti-blooming drain structures—this also being an accomodation to drafting limitations. The columns of the A register 31 and B register 32 (separated by channel stops indicated by dashed line) are consecutively ordinally numbered $0^{th}$ through $(M+1)^{st}$ at top of figure; and the rows of each register are consecutively ordinally numbered first through $K^{th}$. Three-level polysilicon gate electrode structures are used, and the A, B, and C register are all three-phase-clocked. Channels for charge transfer are shown by stippling and channel stops are left unstippled. The imager is designed for interlaced field operation, with the gate electrodes in the A register 31 receiving the first-phase $\phi_{A1}$ of the three-phase A-register clocking being twice as long as those receiving the second phase $\phi_{A2}$ and third-phase $\phi_{A3}$ of the A register clocking. This provides perfect interlace and no field flicker, charge collection being under the $\phi_{A1}$ gate electrodes during a set of alternate fields and being under the $\phi_{A2}$ and $\phi_{A3}$ gate electrodes during the intervening set of alternate fields. Imagers using a different number of phases in A-and-B-register clocking and in C-register clocking may, of course, be used in the invention. Source-follower output from an MOS transistor 36 with gate supplied from a floating diffusion 37 is shown, though other known methods of extracting signal from the C register 33 may be used instead.

The features of the FIG. 4 CCD imager of primary interest to the invention are, firstly, the drain 38 terminating the $0^{th}$ column charge transfer channel after the B register 32 and, secondly, the drain 39 terminating the $(M+1)^{st}$ column charge transfer channel after the B register 32.

What is claimed is:

1. A CCD imager comprising:

a CCD output register for performing parallel-to-series conversion, said CCD output register including a succession M in number of charge-shifting stages recurrently clocked to move charge from one stage to the next, into which charge shifting stages charge packets parallelly supplied said output register are admitted, the admission being during recurrent halts in the clocking of charge packets from each charge-shifting stage in said succession to the next, and said CCD output register further including an output stage from which is supplied response to charge packets moved from the last charge-shifting stage;

a CCD imager register including at least $M+2$ charge transfer channels arranged side-by-side in parallel array, each charge transfer channel containing a respective succession n in number of charge-shifting stages, its charge transfer channels being recurrently clocked in unison to generate a succession of parallelly supplied charge packets, which CCD image register is of the type in which charge packets are generated in portions of its charge-shifting stages during recurrent halts in said clocking in unison, this being done by photoconversion of an optical-frequency radiant-energy image projected into each of the $M+2$ charge transfer channels in said parallel array;

means for applying charge packets from respective outputs of the M charge transfer channels of said CCD image register that are in the middle of said $M+2$ charge transfer channels side-by-side in parallel array, as the charge packets parallelly supplied to respective ones of the charge-shifting stages of said CCD output register; and means for otherwise disposing of the charge packets from the respective outputs of the other charge transfer channels in said CCD image register.

2. A CCD imager as claimed in claim 1 wherein charge packets from respective outputs of the M charge transfer channels of said CCD image register that are in the middle of said $M+2$ charge transfer channels side-by-side in parallel array are substantially directly applied to the M successive charge-shifting stages of said CCD output register.

3. A CCD imager as claimed in claim 2 wherein said means for applying charge packets from respective outputs of the M charge transfer channels of said CCD image register that are in the middle of said $M+2$ charge transfer channels side-by-side in parallel array comprises:

a CCD field storage register having M charge transfer channels connecting from respective ones of said middle M charge transfer channels of said CCD imager to respective ones of the charge-shifting stages of said CCD output register.

4. A CCD imager, being constructed on a substrate of long-lifetime semiconductive material having a CCD image register with a plurality of gate electrodes overspanning parallelled charge transfer channels in each of which charge carriers are generated by photoconversion responsive to a respective portion of an optical image projected into the CCD image register for illuminating at least a portion of each of said charge transfer channels; having a CCD output register with charge transfer channel into respective stages of which output charge packets from respective ones of the parallelled charge transfer channels in the image register are transferred at selected intervals in time, which output register charge transfer channel is at other intervals in time operated to provide parallel-to-series conversion of the charge packets transferred to its stages; having means responding the charge packets supplied from the output of said output register for generating an output signal; and including an improvement for eliminating edge effects in the output signal originating from the initial and final charge packets provided in each parallel-to-series converted output from said output register, which edge effects are attributable to the exchange of charge carriers between (on the one hand) each of the two side ones of the parallelled charge transfer channels in the image register respectively along the opposing sides of the image register parallel to the direction of charge transfer therethrough and (on the other hand) a portion of the semiconductor substrate outside the image register, which improvement comprises:

a pair of further charge transfer channels, adjoining respective side ones of the charge transfer channels in the image register, and being arranged under the overspanning gate electrodes of the image register they flank, said further charge transfer channels being arranged to receive substantially the same illumination as the charge transfer channels they respectively adjoin; and means for discarding charge packets from the outputs of these further charge transfer channels.

5. An improved CCD imager as set forth in claim 4 wherein the means for discarding charge packets from the outputs of the further ones of the charge transfer channels comprises:

drain structures at the output ends of those further ones of the charge transfer channels.

* * * * *